(12) United States Patent
Hayashi et al.

(10) Patent No.: US 8,088,538 B2
(45) Date of Patent: *Jan. 3, 2012

(54) REFLECTIVE MASK BLANK FOR EUV LITHOGRAPHY

(75) Inventors: Kazuyuki Hayashi, Chiyoda-ku (JP);
Kazuo Kadowaki, Chiyoda-ku (JP);
Masaki Mikami, Chiyoda-ku (JP);
Takashi Sugiyama, Chiyoda-ku (JP)

(73) Assignee: Asahi Glass Company, Limited, Tokyo (JP)

( * ) Notice: Subject to any disclaimer, the term of this patent is extended or adjusted under 35 U.S.C. 154(b) by 80 days.

This patent is subject to a terminal disclaimer.

(21) Appl. No.: 12/578,648

(22) Filed: Oct. 14, 2009

(65) Prior Publication Data

US 2010/0035165 A1 Feb. 11, 2010

Related U.S. Application Data

(63) Continuation of application No. PCT/JP2008/054413, filed on Mar. 11, 2008.

(30) Foreign Application Priority Data

Apr. 17, 2007 (JP) .................................. 2007-108042

(51) Int. Cl.
*G03F 1/00* (2006.01)
*B32B 9/00* (2006.01)
(52) U.S. Cl. ........................................... 430/5; 428/428
(58) Field of Classification Search .............. 430/5, 394; 428/428, 430; 378/35
See application file for complete search history.

(56) References Cited

U.S. PATENT DOCUMENTS

| | | | | |
|---|---|---|---|---|
| 7,906,259 B2 * | 3/2011 | Hayashi et al. | | 430/5 |
| 2006/0251973 A1 | 11/2006 | Takaki et al. | | |
| 2008/0182183 A1 | 7/2008 | Hayashi et al. | | |
| 2008/0199787 A1 | 8/2008 | Hayashi et al. | | |
| 2009/0011341 A1 | 1/2009 | Hayashi et al. | | |
| 2009/0130574 A1 | 5/2009 | Hayashi et al. | | |

FOREIGN PATENT DOCUMENTS

EP 1 498 936 A1 1/2005

(Continued)

OTHER PUBLICATIONS

U.S. Appl. No. 12/952,254, filed Nov. 23, 2010, Hayashi.

(Continued)

*Primary Examiner* — Stephen Rosasco
(74) *Attorney, Agent, or Firm* — Oblon, Spivak, McClelland, Maier & Neustadt, L.L.P.

(57) ABSTRACT

Provision of a reflective mask blank for EUV lithography having an absorber layer which has a low reflectance in the wavelength regions of EUV light and pattern inspection light and whose film composition and film thickness are easily controllable to desired ones.

A reflective mask blank for EUV lithography, which comprises a substrate, and a reflective layer to reflect EUV light and an absorber layer to absorb EUV light, formed in this order on the substrate, wherein the absorber layer contains tantalum (Ta), boron (B) and silicon (Si), and in the absorber layer, the content of B is at least 1 at. % and less than 5 at. % and the content of Si is from 1 to 25 at. %, and wherein the absorber layer contains no nitrogen (N) or at most 10 at. % of N.

16 Claims, 1 Drawing Sheet

FOREIGN PATENT DOCUMENTS

| | | |
|---|---|---|
| EP | 2 024 789 | 2/2009 |
| JP | 2003-501823 | 1/2003 |
| JP | 2004-006799 | 1/2004 |
| JP | 2004-039884 | 2/2004 |
| JP | 2006-332153 | 12/2006 |
| JP | 2008-016821 | 1/2008 |
| WO | WO 2007/142365 A1 | 12/2007 |

OTHER PUBLICATIONS

U.S. Appl. No. 12/855,053, filed Aug. 12, 2010, Hayashi, et al.
U.S. Appl. No. 13/004,081, filed Jan. 11, 2011, Hayashi, et al.
U.S. Appl. No. 13/093,968, filed Apr. 26, 2011, Hayashi.
U.S. Appl. No. 13/070,728, filed Mar. 24, 2011, Hayashi.

* cited by examiner

REFLECTIVE MASK BLANK FOR EUV LITHOGRAPHY

TECHNICAL FIELD

The present invention relates to a reflective mask blank (in this specification, hereinafter referred to as "EUV mask blank") for EUV (Extreme Ultra Violet) lithography to be used for e.g. production of semiconductors.

BACKGROUND ART

In the semiconductor industry, a photolithography method using visible light or ultraviolet light has been employed as a technique for writing, on a Si substrate or the like, a fine pattern, which is required for forming an integrated circuit comprising such a fine pattern. However, the conventional photolithography method has been close to the resolution limit, while microsizing of semiconductor devices has been accelerated. In the case of the photolithography method, it is said that the resolution limit of a pattern is about ½ of an exposure wavelength, and that even if an immersion method is employed, the resolution limit is about ¼ of an exposure wavelength. Even if an immersion method using an ArF laser (193 nm) is employed, it is estimated that the resolution limit is about 45 nm. From this point of view, EUV lithography, which is an exposure technique using EUV light having a shorter wavelength than ArF lasers, is considered to be promising as an exposure technique for 45 nm or below. In this specification, "EUV light" means a ray having a wavelength in a soft X-ray region or a vacuum ultraviolet ray region, specifically a ray having a wavelength of from about 10 to 20 nm, in particular, of about 13.5 nm±0.3 nm.

EUV light is apt to be absorbed by any substances and the refractive indices of substances are close to 1 at this wavelength, whereby it is impossible to use a dioptric system like a conventional photolithography employing visible light or ultraviolet light. For this reason, for EUV light lithography, a catoptric system, i.e. a combination of a reflective photomask and a mirror, is employed.

A mask blank is a stacked member for fabrication of a photomask, which has not been patterned yet. In the case of an EUV mask blank, it has a structure wherein a substrate made of glass or the like has a reflective layer to reflect EUV light and an absorber layer to absorb EUV light, formed thereon in this order. As the reflective layer, a multilayer reflective film is usually used wherein high refractive index layers and low refractive index layers are alternately stacked to increase a light reflectance when irradiating the layer surface with EUV light. For the absorber layer, it is common to employ a material having a high absorption coefficient for EUV light, specifically e.g. a material containing Cr or Ta as the main component.

Patent Document 1 discloses that a nitride of a tantalum/boron alloy (TaBN), an oxide of a tantalum/boron alloy (TaBO) and an oxynitride of a tantalum/boron alloy (TaBNO) have high absorption coefficients for EUV light, and further have a low reflectance against deep-ultraviolet light within a wavelength region (from 190 nm to 260 nm) of light for inspection of a pattern, and thus, they are preferred as materials for an absorber layer.

Further, Patent Document 1 discloses that in order to make the absorber layer surface to be a surface excellent in flatness and smoothness, the crystalline structure of the absorber layer is preferably amorphous, and in order to make the crystalline structure of a TaBN film, a TaBO film and a TaBNO film to be amorphous, the content of B in such films is preferably from 5 to 25 at. % (atomic percent).

Patent Document 1: JP-A-2004-6799

DISCLOSURE OF THE INVENTION

Problems to be Solved by the Invention

However, in a case where the absorber layer is made of a TaBO film or a TaBNO film, if the content of oxygen (O) in the film increases, the insulating property of the absorber layer increases, and at the time of electron beam writing in such an absorber layer, charge-up takes place, such being undesirable.

On the other hand, in a case where the absorber layer is made of a TaBN film, there will be no possibility that charge-up will occur at the time of electron beam writing.

In a case where the absorber layer is to be made of a TaBN film, film deposition is carried out by using a magnetron sputtering method as a method whereby defects are less likely to result. In such a case, for example, a Ta target and a B target may be used, and such targets may be discharged at the same time in a nitrogen atmosphere to form a TaBN film. Otherwise, a TaB compound target may be used, and such a compound target may be discharged in a nitrogen atmosphere to form a TaBN film.

However, for example, in the case of the method of using a Ta target and a B target, the B target has a high resistance and is a light element and thus its film deposition rate is at most ¹⁄₁₀ as compared with the Ta target in many cases. Therefore, in order to attain the content (at least 5 at. %) of B required to make the crystalline state of the film to be amorphous, as disclosed in Patent Document 1, the film deposition rate of the Ta target is required to be low, such being undesirable as the production efficiency decreases substantially.

On the other hand, in the method of using the TaB compound target, if a compound target comprising 20 at. % of B and 80 at. % of Ta, is, for example, used, the maximum content of B to be actually incorporated in the film will be at a level of 6 at. %, whereby it will be difficult to control the content of B in the film to be at least 5 at. %. Further, if N is added, the content of B in the film tends to be at most 4 at. %, whereby the crystalline state of the film cannot be made to be amorphous.

In order to solve this problem, it is conceivable to further increase the B content in the TaB compound target (for example, B is made to be 50 at. %, and Ta is made to be 50 at. %) to increase the content of boron (B) in the film. However, as the content of B in the TaB target increases, the electrical resistance of the TaB target increases, whereby the discharge tends to be unstable, and the film deposition rate tends to be slow. If the discharge becomes unstable, the composition or thickness of the film tends to be non-uniform, and in some cases, film deposition may become impossible.

Further, Patent Document 1 discloses that by forming the absorber layer of a TaBN film or a TaBNO film (i.e. by further containing N in TaB), it is possible to improve the smoothness of the absorber layer and to reduce the surface roughness. However, when N is contained in the absorber layer, there occurs such a problem as lowering of an etching rate or lowering of the contrast for pattern inspection light.

It is an object of the present invention to solve the above-described problems of the prior art and to provide an EUV mask blank which is excellent in the characteristics as an EUV mask blank and which has an absorber layer which has a particularly low reflectance within a wavelength region of EUV light and light for inspection of a pattern and being easily controlled to have a desired film composition and film thickness.

Means for Solving the Problems

The present inventors have conducted an extensive study to solve the above problems and as a result, have found that when the absorber layer is made of a film (a TaBSi film) containing tantalum (Ta), boron (B) and silicon (Si), and when the absorber layer contains no nitrogen (N) or contains at most 10 at. % of N, then, it is possible to obtain an absorber layer excellent in etching properties and optical properties and excellent in surface smoothness since the crystalline structure of the film is amorphous.

The present invention has made on the basis of such discoveries and provides a reflective mask blank for EUV lithography, which comprises a substrate, and a reflective layer to reflect EUV light and an absorber layer to absorb EUV light, formed in this order on the substrate, wherein the absorber layer contains tantalum (Ta), boron (B) and silicon (Si), and in the absorber layer, the content of B is at least 1 at. % and less than 5 at. % and the content of Si is from 1 to 25 at. %, and wherein the absorber layer contains no N or at most 10 at. % of N.

Further, the present invention provides a reflective mask blank for EUV lithography, which comprises a substrate, and a reflective layer to reflect EUV light and an absorber layer to absorb EUV light, formed in this order on the substrate, wherein the absorber layer contains tantalum (Ta), boron (B) and silicon (Si), the absorber layer contains no N or at most 10 at. % of N, and the crystalline state of the absorber layer is amorphous.

In the EUV mask blank of the present invention, it is preferred that the absorber layer contains no nitrogen (N) or at most 5 at. % of N.

In the EUV mask blank of the present invention, it is preferred that the absorber layer has a surface roughness (mean square surface roughness) of at most 0.5 nm rms.

In the EUV mask blank of the present invention, it is preferred that a low reflective layer against an inspection light to be used for inspection of a mask pattern is formed on the absorber layer, the low reflective layer contains tantalum (Ta), boron (B), silicon (Si) and oxygen (O), and in the low reflective layer, the content of B is at least 1 at. % and less than 5 at. %, the content of Si is from 1 to 25 at. %, and the compositional ratio (Ta:O) of Ta to O is from 7:2 to 1:2.

Further, in the EUV mask blank of the present invention, it is preferred that a low reflective layer against an inspection light to be used for inspection of a mask pattern is formed on the absorber layer, the low reflective layer contains tantalum (Ta), boron (B), silicon (Si), oxygen (O) and nitrogen (N), and in the low reflective layer, the content of B is at least 1 at. % and less than 5 at. %, the content of Si is from 1 to 25 at. %, and the compositional ratio (Ta:(O+N)) of Ta to O and N is from 7:2 to 1:2.

In the EUV mask blank of the present invention, when a low reflective layer is formed on the absorber layer, it is preferred that the surface roughness of the surface of the low reflective layer is at most 0.5 nm rms.

In the EUV mask blank of the present invention, when a low reflective layer is formed on the absorber layer, it is preferred that the low reflective layer has a thickness of from 5 to 30 nm.

Further, in the EUV mask blank of the present invention, it is preferred that a protective layer to protect the reflective layer during formation of a pattern in the absorber layer, is formed between the reflective layer and the absorber layer, and the contrast between light reflected on the surface of the protective layer and light reflected on the surface of the low reflective layer at a wavelength of light to be used for inspection of the pattern formed in the absorber layer, is at least 30%.

When a protective layer is formed between the reflective layer and the absorber layer, it is preferred that the protective layer is formed of any one selected from the group consisting of a Ru compound, $SiO_2$ and CrN.

When a low reflective layer is formed on the absorber layer, it is preferred that the reflectance on the surface of the low reflective layer at a wavelength of light to be used for inspection of the pattern formed in the absorber layer, is at most 15%.

In the EUV mask blank of the present invention, it is preferred that the absorber layer is formed by carrying out a sputtering method using a target made of a TaBSi compound in an atmosphere wherein the total partial pressure of gases containing nitrogen atoms is not more than $1 \times 10^{-4}$ Pa.

It is preferred that the target made of a TaBSi compound has a composition comprising Ta=50 to 94 at. %, Si=5 to 30 at. % and B=1 to 20 at. %.

When a low reflective layer is formed on the absorber layer, it is preferred that the low reflective layer is formed by carrying out a sputtering method using a target made of a TaBSi compound in an atmosphere containing oxygen.

It is preferred that the target made of a TaBSi compound has a composition comprising Ta=50 to 94 at. %, Si=5 to 30 at. % and B=1 to 20 at. %.

Effects of the Invention

In the EUV mask blank of the present invention, since the content of B in the absorber layer is low (less than 5 at. %), at a time of film-deposition of the absorber layer, there will be no problem due to lowering of film-deposition speed or unstability of discharge, such as unevenness in the film composition or film thickness or failure of film-deposition.

Further, since the absorber layer contains no N or a low content (at most 10 at. %) of N, there will be no such problem as lowering of etching rate or lowering of the contrast for pattern inspection light.

In the EUV mask blank of the present invention, since the crystalline structure of the absorber layer is amorphous, the surface of the absorber is excellent in smoothness.

Further, the absorber layer has such properties as low light reflectance for EUV light or low light reflectance for light in the wavelength region of pattern inspection light, that are required for an EUV mask blank.

In the EUV mask blank of the present invention, by forming a low reflective layer on the absorber layer, it is possible to further lower the light reflectance in the wavelength region of pattern inspection light, and to improve the contrast at a time of pattern inspection carried out after a pattern is formed on the mask blank.

In the EUV mask blank of the present invention, at a time of forming the absorber layer and the low reflective layer by a sputtering method, by employing a TaBSi compound target having a specific composition, it is possible to avoid unstability of discharge or unevenness of the composition or the film thickness of the film.

MEANINGS OF SYMBOLS

1: EUV mask blank
11: Substrate
12: Reflective layer (multilayer reflective film)
13: Protective layer
14: Absorber layer
15: Low reflective layer

BEST MODE FOR CARRYING OUT THE INVENTION

Now, the EUV mask blank of the present invention will be described with reference to the drawings.

Figure 1:
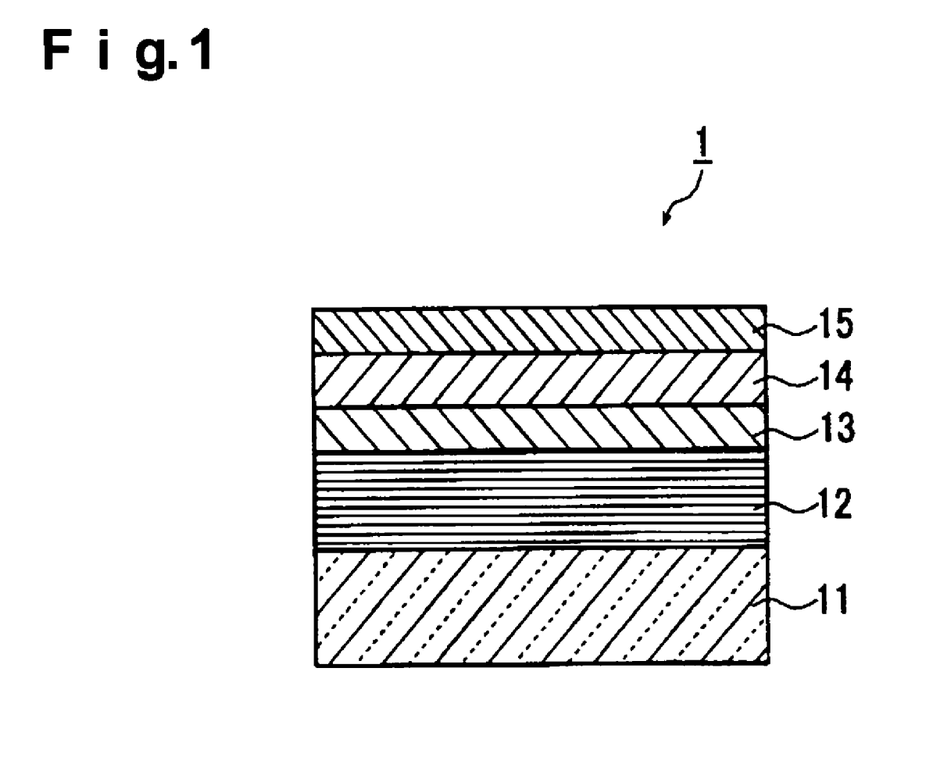
FIG. 1 is a schematic cross-sectional view illustrating one embodiment of the EUV mask blank of the present invention.

FIG. 1 is a schematic cross-sectional view illustrating one embodiment of the EUV mask blank of the present invention. In the mask blank 1 shown in FIG. 1, a reflective layer 12 to reflect EUV light and an absorber layer 14 to absorb EUV light are formed in this order on a substrate 11. Between the reflective layer 12 and the absorber layer 14, a protective layer 13 to protect the reflective layer 12 during formation of a pattern in the absorber layer 14, is formed. On the absorber layer 14, a low reflective layer 15 against an inspection light to be used for inspection of a mask pattern is formed. However, in the EUV mask blank 1 of the present invention, in the construction shown in FIG. 1, only the substrate 11, the reflective layer 12 and the absorber layer 14 are essential, and the protective layer 13 and the low reflective layer 15 are optional constituting elements. Here, in the EUV mask blank of the present invention, a film other than the above films can be optionally provided.

Now, the individual constituting elements of the mask blank 1 will be described.

The substrate 11 is required to satisfy the characteristics as a substrate for an EUV mask blank. Therefore, the substrate 11 is preferably one which has a low thermal expansion coefficient (preferably $0\pm0.05\times10^{-7}/^\circ$ C., more preferably $0\pm0.03\times10^{-7}/^\circ$ C.) and which is excellent in smoothness, flatness and resistance against a cleaning liquid to be used for e.g. cleaning of a mask blank or a photomask after formation of a pattern. Specifically, as such a substrate 11, glass having a low thermal expansion coefficient, such as a $SiO_2$—$TiO_2$ glass, may, for example, be used, but the substrate is not limited thereto, and a substrate of e.g. crystallized glass having β-quartz solid solution precipitated, quartz glass, silicon or metal, may also be used.

The substrate 11 preferably has a smooth surface of at most 0.15 nm rms and a flatness of at most 100 nm, whereby a high reflectance and transfer precision can be obtained with a photomask after formation of a pattern.

The size, thickness, etc. of the substrate 11 are suitably determined depending upon the design values of the mask. In Examples shown hereinafter, a $SiO_2$—$TiO_2$ glass having a size of 6 inch (152 mm) square and a thickness of 0.25 inch (6.3 mm) was used.

It is preferred that no defects are present on the surface of the substrate 11 on the side on which the reflective layer 12 is to be formed. Even if they are present, in order that no phase defects will form by concave defects and/or convex defects, the depth of the concave defects and the height of the convex defects are preferably at most 2 nm, and the half value widths of such concave defects and convex defects are preferably at most 60 nm.

The reflective layer 12 is not particularly restricted so long as it is one having desired characteristics as a reflective layer for an EUV mask blank. Here, the characteristic particularly required for the reflective layer 12 is a high EUV light reflectance. Specifically, when the surface of the reflective layer 12 is irradiated with light in a wavelength region of EUV light, the maximum value of the light reflectance in the vicinity of a wavelength of 13.5 nm is preferably at least 60%, more preferably at least 65%. Even in a case where a protective layer 13 or a low reflective layer 15 is formed on the reflective layer 12, the maximum value of the light reflectance in the vicinity of a wavelength of 13.5 nm is preferably at least 60%, more preferably at least 65%.

As the reflective layer 12, a reflective multilayer film having high refractive index layers and low refractive index layers ultimately stacked in a plurality of times, is usually used as the reflective layer 12, whereby a high EUV light reflectance can be attained. In the reflective multilayer film constituting the reflective layer 12, Mo is widely used for the high refractive index layers, and Si is widely used for the low refractive index layers. Namely, a reflective Mo/Si multilayer film is most common. However, the reflective multilayer film is not limited thereto, and a reflective Ru/Si multilayer film, a reflective Mo/Be multilayer film, a reflective Mo compound/Si compound multilayer film, a reflective Si/Mo/Ru multilayer film, a reflective Si/Mo/Ru/Mo multilayer film or a reflective Si/Ru/Mo/Ru multilayer film etc. may also be used.

The thicknesses and the number of repeating layer units of the respective layers constituting the reflective multilayer film constituting the reflective layer 12 may suitably be selected depending upon the film materials to be used and the EUV light reflectance required for the reflective layer. When a reflective Mo/Si multilayer film is taken as an example, in order to form a reflective layer 12 having the maximum value of the EUV light reflectance being at least 60%, the reflective multilayer film may be formed by stacking Mo layers having a thickness of 2.3±0.1 nm and Si layers having a thickness of 4.5±0.1 nm so that the number of repeating units will be from 30 to 60.

Here, the respective layers constituting the reflective multilayer film as the reflective layer 12 may be formed to have the desired thickness by means of a well-known film deposition method such as magnetron sputtering or ion beam sputtering. For example, in a case where a reflective Si/Mo multilayer film is formed by means of ion beam sputtering, it is preferred that a Si film is deposited to have a thickness of 4.5 nm at an ion-accelerated voltage of from 300 to 1,500 V at a film deposition rate of from 0.03 to 0.30 nm/sec by using a Si target as the target and using an Ar gas (gas pressure: $1.3\times10^{-2}$ Pa to $2.7\times10^{-2}$ Pa) as the sputtering gas, and then a Mo film is deposited to have a thickness of 2.3 nm at an ion-accelerated voltage of from 300 to 1,500 V at a film deposition rate of from 0.03 to 0.30 nm/sec by using a Mo target as the target and using an Ar gas (gas pressure: $1.3\times10^{-2}$ Pa to $2.7\times10^{-2}$ Pa) as the sputtering gas. This operation is regarded as one cycle, and by stacking Si films and Mo films for 40 to 50 cycles, a reflective Si/Mo multilayer film will be formed.

In order to prevent oxidation of the surface of the reflective layer 12, the uppermost layer of the reflective multilayer film constituting the reflective layer 12 is preferably a layer made of a hardly oxidizable material. The layer made of a hardly oxidizable material will function as a cap layer of the reflective layer 12. As a specific example of the layer made of a hardly oxidizable material functioning as cap layer, a Si layer may, for example, be mentioned. In a case where the reflective multilayer film constituting the reflective layer 12 is a Si/Mo film, the uppermost layer may be made to be a Si layer, so that the uppermost layer will function as a cap layer. In such a case, the thickness of the cap layer is preferably 11.0±1.0 nm.

The protective layer 13 is provided for the purpose of protecting the reflective layer 12, so that the reflective layer 12 will not receive a damage by an etching process at the time of forming a pattern in the absorber layer 14 by an etching process, usually by a dry etching process. Accordingly, as the material for the protective layer 13, a material is selected which is hardly susceptible to an influence by the etching process of the absorber layer 14, i.e. a material having an etching rate slower than the absorber layer 14 and yet is hardly susceptible to a damage by such an etching process. A material which satisfies such conditions, may, for example, be Cr, Al, Ru, Ta or Their nitrides, as well as $SiO_2$, $Si_3N_4$, $Al_2O_3$ or a mixture thereof. Among them, a Ru compound (Ru or RuB), CrN or $SiO_2$ is preferred, and a Ru compound (Ru or RuB) is particularly preferred.

The thickness of the protective layer 13 is preferably from 1 to 60 nm, more preferably from 1 to 10 nm.

The protective layer 13 is formed by using a well-known film deposition method such as magnetron sputtering or ion beam sputtering. In a case where a Ru film is formed by magnetron sputtering, it is preferred to carry out film deposition at an applied electric power of from 30 W to 500 W at a film deposition rate of from 5 to 50 nm/min so that the thickness will be from 2 to 5 nm by using a Ru target as the target and using an Ar gas (gas pressure: $1.0 \times 10^{-1}$ Pa to $10 \times 10^{-1}$ Pa) as the sputtering gas.

The characteristic particularly required for the absorber layer 14 is that the EUV light reflectance is very low. Specifically, when the surface of the absorber layer 14 is irradiated with light in a wavelength region of EUV light, the maximum light reflectance in the vicinity of a wavelength of 13.5 nm is preferably at most 0.5%, more preferably at most 0.1%.

In order to attain the above characteristic, the absorber layer is preferably made of a material having a high absorption coefficient of EUV light.

The absorber layer 14 of the EUV mask blank 1 of the present invention contains tantalum (Ta), boron (B) and silicon (Si) in a specific ratio which will be described hereinafter, whereby the above characteristic is attained.

The content of B in the absorber layer 14 is at least 1 at. % and less than 5 at. %. Heretofore, when a film (such as a TaB film, a TaBN film, a TaBO film or a TaBNO film) containing Ta and B is used as the absorber layer, in order to make the crystalline state of the film amorphous, it has been necessary to make the content of B in the film at least 5 at. %. However, as described above, if the content of B in the film is at least 5 at. %, there has been such a problem as slow film-deposition rate or difficulty in control of the content of B in the film or the film thickness.

In the EUV mask blank 1 of the present invention, the absorber layer 14 contains Ta, B and Si at a specific ratio, whereby even if the content of B in the absorber layer 14 is less than 5 at. %, the crystalline state of the absorber layer 14 becomes amorphous.

If the content of B in the absorber layer 14 is less than 1 at. %, it may be necessary to increase the content of Si to make the crystalline state of the absorber layer 14 amorphous. Specifically, it may be necessary to make the content of Si more than 25 at. %, which increases the film thickness of the absorber layer to make the EUV light beam reflectivity at most 0.5%, such being not preferred. If the content of B in the absorber layer is at least 5 at. %, the above problems such as lowering of film-deposition rate may occur.

The content of B in the absorber layer 14 is more preferably from 1 to 4.5 at. %, further preferably from 1.5 to 4 at. %.

When the content is from 1.5 to 4 at. %, it is possible to carry out the film-deposition stably, and to attain e.g. an excellent smoothness being a characteristic required for a mask, and they are well balanced, such being extremely preferred.

The content of Si in the absorber layer 14 is from 1 to 25 at. %. If the content of Si in the absorber layer 14 is less than 1 at. %, the crystalline state of the absorber layer 14 does not become amorphous, such being not preferred. Since Si is a material having a low absorption coefficient of EUV light, if the content of Si in the absorber layer 14 exceeds 25 at. %, the film thickness of the absorber layer required for attaining an EUV light reflectance of at most 0.5% becomes thick, such being not preferred.

The content of Si in the absorber layer 14 is more preferably from 1 to 20 at. %, further preferably from 2 to 15%, still more preferably from 2 to 8%.

The remainder of the absorber layer 14 other than B and Si is preferably Ta element. The content of Ta in the absorber layer 14 is preferably from 60 to 85 at. %, more preferably from 65 to 80 at. %.

Here, the absorber layer 14 may contain elements other than Ta, B and Si, but the absorber layer 14 needs to satisfy the characteristics such as the EUV light beam absorbing property, that are required for a mask blank. For this reason, the absorber layer 14 preferably contains no nitrogen (N). Specifically, the absorber layer 14 contains no N or contains N with a content of at most 10 at. %. If the N content in the absorber layer 14 exceeds 10 at. %, a problem such as lowering of etching rate or lowering of the contrast for pattern inspection light, may occur. The content of N in the absorber layer 14 is preferably at most 5 at. %, more preferably at most 3 at. %, and it is particularly preferred that the absorber layer 14 contains substantially no N except for one inevitably contained, in terms of insulation property.

With the absorber layer 14 being of the above-described construction, its crystalline state is preferably amorphous. In this specification, "the crystalline state is amorphous" includes one having a fine crystalline structure in addition to one having an amorphous structure with no crystalline structure at all. When the absorber layer 14 is a film of an amorphous structure or a film of a fine crystalline structure, the surface of the absorber layer 14 is excellent in smoothness.

In the EUV mask blank 1 of the present invention, the absorber layer 14 is a film of an amorphous structure or a film of a fine crystalline structure, whereby the surface roughness of the absorber layer 14 is at most 0.5 nm rms. If the surface roughness of the absorber layer 14 is large, the edge roughness of a pattern formed in the absorber layer 14 tends to be large, whereby the dimensional precision of the pattern tends to deteriorate. As the pattern becomes fine, the influence of the edge roughness becomes distinct, and therefore, the surface of the absorber layer 14 is required to be preferably smooth.

When the surface roughness of the absorber layer 14 is at most 0.5 nm rms, the surface for the absorber layer 14 is sufficiently smooth, whereby there will be no possibility of deterioration of the dimensional precision of a pattern due to an influence of the edge roughness. The surface roughness of the absorber layer 14 is more preferably at most 0.4 nm rms, further preferably at most 0.3 nm.

Further, the crystalline state of the absorber layer 14 being amorphous, i.e. being of an amorphous structure or a fine crystalline structure, can be ascertained by an X-ray diffraction (XRD) method. When the crystalline state of the absorber layer 14 is of an amorphous structure or a fine crystalline structure, no sharp peak is observed among the diffraction peaks obtainable by the XRD measurement.

The thickness of the absorber layer 14 is preferably from 50 to 100 nm, more preferably from 50 to 70 nm. The absorber layer 14 having the above construction can be formed by using a known film-deposition method, for example, a sputtering method such as a magnetron sputtering method or an ion beam sputtering method. When the magnetron sputtering method is employed, the absorber layer 14 can be formed by any one of the following methods (1) to (3).

(1) A Ta target, a B target and an Si target are employed, and discharges at these targets are carried out simultaneously in an argon (Ar) atmosphere to form the absorber layer 14.
(2) A TaB compound target and an Si target are employed, and discharges at these targets are carried out simultaneously in an argon atmosphere to form the absorber layer 14.
(3) A TaBSi compound target is employed, and a discharge at the target wherein these three elements are integrated, is carried out in an argon atmosphere to form the absorber layer 14.

In the above methods (1) to (3), the argon atmosphere means an environment wherein gas containing nitrogen atoms (such as $N_2$ or NO) is not substantially present, which is specifically an environment wherein the total partial pressure of the gases containing nitrogen atoms is not more than $1 \times 10^{-4}$ Pa.

Here, among the above methods, in the methods ((1) and (2)) of discharging at at least two targets simultaneously, it is possible to control the composition of the absorber layer 14 to be formed, by controlling the input electric power of each target.

Among the above methods, the methods (2) and (3) are preferred for the reason that it is possible to avoid instability of discharge or variation of the film composition or the film thickness, and the method (3) is particularly preferred. The TaBSi compound target particularly preferably has a composition of Ta=50 to 94 at. %, Si=5 to 30 at. % and B=1 to 20 at. % for the reason that it is possible to avoid instability of discharge or the variation of film composition or the film thickness.

The absorber layer 14 can be formed by carrying the above methods, specifically under the following film-deposition conditions.

Method (2) of Employing TaB Compound Target and Si Target

Sputtering gas: Ar gas (gas pressure: $1.0 \times 10^{-1}$ Pa to $50 \times 10^{-1}$ Pa, preferably $1.0 \times 10^{-1}$ Pa to $40 \times 10^{-1}$ Pa, more preferably $1.0 \times 10^{-1}$ Pa to $30 \times 10^{-1}$ Pa.).

Input electric power (for each target): 30 to 1,000 W, preferably 50 to 750 W, more preferably 80 to 500 W.

Film-deposition rate: 2.0 to 60 nm/min, preferably 3.5 to 45 nm/min, more preferably 5 to 30 nm/min.

Method (3) of Employing TaBSi Compound Target

Sputtering gas: Ar gas (gas pressure: $1.0 \times 10^{-1}$ Pa to $50 \times 10^{-1}$ Pa, preferably $1.0 \times 10^{-1}$ Pa to $40 \times 10^{-1}$ Pa, more preferably $1.0 \times 10^{-1}$ Pa to $30 \times 10^{-1}$ Pa.).

Input electric power: 30 to 1,000 W, preferably 50 to 750 W, more preferably 80 to 500 W.

Film-deposition rate: 2.0 to 60 nm/min, preferably 3.5 to 45 nm/min, more preferably 5 to 30 nm/min.

The low reflective layer 15 is constituted by a film which shows a low reflectance against an inspection light to be used for inspection of a mask pattern. In the preparation of a EUV mask, after forming a pattern in the absorber layer, inspection is carried out to ascertain whether the pattern is formed as designed. In such an inspection of a mask pattern, an inspection machine is usually used wherein light of about 257 nm is used as an inspection light. Namely, inspection is carried out by the difference in the reflectance against such light of about 257 nm, specifically by the difference in the reflectance between the surface exposed by removal of the absorber layer 14 by formation of a pattern and the surface of the absorber layer 14 remained without being removed by the formation of the pattern. Here, the former is the surface of the reflective layer 12 or the surface of the protective layer 13, usually the surface of the protective layer 13. Accordingly, if the difference in the reflectance between the surface of the protective layer 13 and the surface of the absorber layer 14 against the wavelength of the inspection light is small, the contrast at the time of the inspection becomes poor, and no accurate inspection can be done.

The absorber layer 14 having the above-described construction has an extremely low EUV light reflectance and thus has an excellent characteristic as an absorber layer for an EUV mask blank 1, but when inspected with the wavelength of the inspection light, the light reflectance may not necessarily be said to be sufficiently low. As a result, the difference between the reflectance on the surface of the absorber layer 14 and the reflectance on the surface of the protective layer 13 at the wavelength of the inspection light may be small, and the contrast at the time of inspection may not be sufficiently obtained. If the contrast at the time of the inspection is not sufficiently obtained, defects in the pattern cannot sufficiently be identified in the mask inspection, and no accurate inspection of defects can be carried out.

In the EUV mask blank 1 of the present invention, by forming a low reflective layer 15 against the inspection light is formed on the absorber layer 14, the contrast at the time of the inspection will be good. In other words, the light reflectance at the wavelength of the inspection light will be very low. Specifically, when the surface of the low reflective layer 15 is irradiated with light in a wavelength region of the inspection light, the maximum light reflectance at the wavelength of the inspection light is preferably at most 15%, more preferably at most 10%, further preferably at most 5%.

When the light reflectance at the wavelength of the inspection light on the surface of the low reflective layer 15 is at most 15%, the contrast at the time of the inspection is good. Specifically, the contrast between reflected light with the wavelength of the inspection light on the surface of the protective layer 13 and reflected light with the wavelength of the inspection light on the surface of the low reflective layer 15, is at least 40%.

In this specification, the contrast can be obtained by using the following formula.

$$\text{Contrast}(\%) = ((R_2 - R_1)/(R_2 + R_1)) \times 100$$

Figure 2:
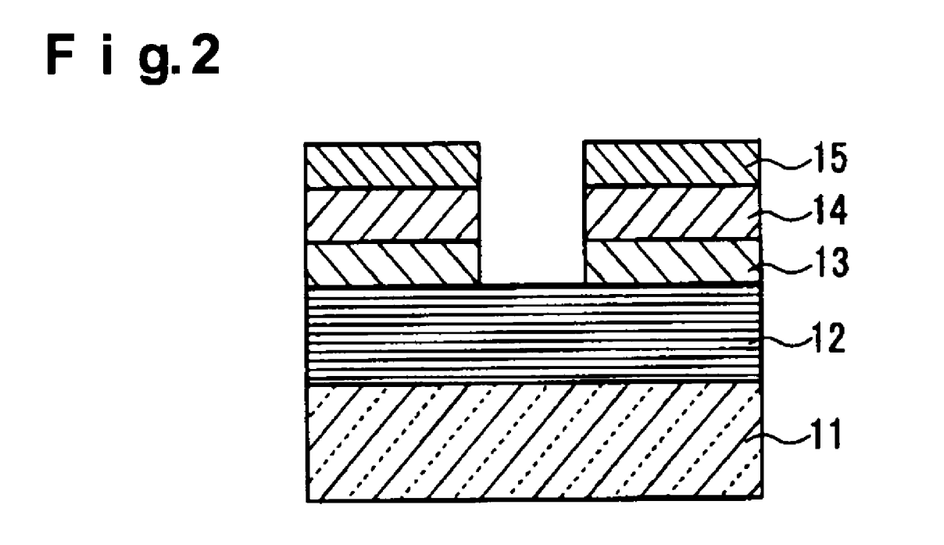
FIG. 2 illustrates a state wherein a pattern was formed in an absorber layer 14 (and a low reflective layer 15) of the EUV mask blank 1 shown in FIG. 1.

Here, at the wavelength of the inspection light, $R_2$ is the reflectance on the surface of the protective layer 13, and $R_1$ is the reflectance on the surface of the low reflective layer 15. The above $R_1$ and $R_2$ are measured in a state where, as shown in FIG. 2, a pattern is formed in the absorber layer 14 (and the low reflective layer 15) of an EUV mask blank 1 shown in FIG. 1. The above $R_2$ is a value measured at the surface of the reflective layer 12 or the surface of the protective layer 13 exposed by removal of the absorber layer 14 and the low reflective layer 15 by the formation of the pattern, and $R_1$ is a value measured at the surface of the low reflective layer 15 remained without being removed by the formation of the pattern, in FIG. 2.

In the present invention, the contrast represented by the above formula is more preferably at least 50%, further preferably at least 80%, particularly preferably at least 90%.

In order to attain the above-described characteristic, the low reflective layer 15 is preferably made of a material having a refractive index at the wavelength of the inspection light being lower than the absorber layer 14, and its crystalline state is preferably amorphous.

So long as the above characteristics are satisfied, the composition is not particularly limited. However, in the first embodiment of the low reflective layer 15 of the EUV mask blank 1 of the present invention, the above characteristics are satisfied when the layer contains Ta, B, Si and oxygen (O) in the specific ratio described below.

The content of B in the low reflective layer 15 is at least 1 at. % and less than 5 at. %. As described above with respect to the absorber layer, in a case of employing a film (such as a TaB film, a TaBN film, a TaBO film or a TaBNO film) containing Ta and B, it has been necessary for the film to contain B with a content of at least 5 at. % to make the crystalline state of the film amorphous.

In the EUV mask blank 1 of the present invention, when the low reflective layer 15 contains tantalum (Ta), boron (B), silicon (Si) and oxygen (O) with a specific ratio, even if the content of B in the low reflective layer 15 is less than 5 at. %, the crystalline state of the low reflective layer becomes amorphous.

If the content of the B in the low reflective layer 15 is less than 1 at. %, it may be necessary to increase the content of Si in order to make the crystalline state of the low reflective layer 15 amorphous. Specifically, it may be necessary to make the content of Si more than 25 at. %, which increases the total film thickness of the absorber layer 14 and the low reflective layer 15 to attain an EUV light reflectance of at most 0.5%, although depending on the Si content and the film thickness of the absorber layer 14, such being not preferred. If the content of B in the low reflective layer 15 is at least 5 at. %, such a problem as decrease of film-deposition rate, that is the same as one described with respect to the absorber layer 14, may occur.

The content of B in the low reflective layer 15 is preferably from 1 to 4.5 at. %, more preferably from 1.5 to 4 at. %.

The content of Si in the low reflective layer 15 is from 1 to 25 at. %. If the content of Si in the low reflective layer 15 is less than 1 at. %, the crystalline state of the low reflective layer 15 does not become amorphous. Since Si is a material having a low reflectance against EUV alight, if the content of Si in the low reflective layer 15 exceeds 25 at. %, the total film thickness of the absorber layer 14 and the low reflective layer 15 to attain an EUV light reflectance of at most 0.5% becomes large, although depending on the Si content and the film thickness of the absorber layer 14, such being not preferred.

The Si concentration in the low reflective layer 15 is preferably from 1 to 20 at. %, more preferably from 2 to 10 at. %.

The remainder of the low reflective layer 15 other than B and Si are Ta and O. The compositional ratio (Ta:O) of Ta to O in the low reflective layer 15 is from 7:2 to 1:2. If the ratio of Ta is higher than the above compositional ratio, it may not be possible to sufficiently lower the light reflectance in the wavelength region of pattern inspection light. On the other hand, if the ratio of O is higher than the above composition ratio, the insulation property increases and charge-up may occur by irradiation with an electron beam. Further, since the film density decreases, the insulation property of the low reflective layer 15 increases and charge-up occurs at a time of electron beam lithography on the low reflective layer 15, such being not preferred. Here, since the low reflective layer 15 is thinner than the absorber layer 14 in the film thickness, the low reflective layer 15 less likely shows charge-up. For this reason, the upper limit of the O concentration in the low reflective layer 15 is looser than that of the absorber layer 14.

The content ratio (Ta:O) of Ta to O in the low reflective layer 15 is preferably from 7:2 to 1:1, more preferably from 2:1 to 1:1.

In the EUV mask blank 1 of the present invention, the low reflective layer 15 may contain N besides Ta, B, Si and O.

Namely, in the EUV mask blank 1 of the present invention, a second embodiment of the low reflective layer 15 contains Ta, B, Si, O and N with a specific ratio described below, whereby the above characteristics are achieved.

Here, when the low reflective layer 15 contains N, it is considered that the smoothness of a surface of the low reflective layer 15 improves.

Hereinafter in this specification, the first embodiment of the low reflective layer is referred to as low reflective layer (TaBSiO) and the second embodiment is referred to as low reflective layer (TaBSiON), so as to distinguish these embodiments. Here, although TaBSiO being a material of the low reflective layer is insulative, since the low reflective layer usually has a small film thickness, a problem of charge-up in the electron beam lithography scarcely occurs.

The content of B in the low reflective layer (TaBSiON) is at least 1 at. % and less than 5 at. %. If the content of B in the low reflective layer 15 is less than 1 at. %, it may be necessary to increase the content of Si to make the crystalline state of the low reflective layer 15 amorphous. Specifically, it may be necessary to make the content of Si more than 25 at. %, and although depending on the Si content and the film thickness of the absorber layer 14, the total film thickness of the absorber layer 14 and the low reflective layer 15 required to attain an EUV light reflectance of at most 0.5%, becomes large, such being not preferred. If the content of B in the low reflective layer 15 is at least 5 at. %, a problem such as decrease of film-deposition rate that is the same as one described with respect to the absorber layer 14, may occur.

The content of B in the low reflective layer (TaBSiON) is more preferably from 1 to 4.5 at. %, further preferably from 2 to 4 at. %.

The content of Si in the low reflective layer (TaBSiON) is from 1 to 25 at. %. If the content of Si in the low reflective layer (TaBSiON) is less than 1 at. %, the crystalline state of the low reflective layer (TaBSiON) does not become amorphous. Since Si is a material having a low absorption coefficient of EUV light, if the content of Si in the low reflective layer 15 exceeds 25 at. %, although depending on the Si content and the film thickness of the absorber layer 14, the total film thickness of the absorber layer 14 and the low reflective layer 15 required for attaining a EUV light reflectance of at most 0.5%, becomes large, such being not preferred.

The content of Si in the low reflective layer (TaBSiON) is preferably from 1 to 20 at. %, more preferably from 2 to 10 at. %.

The remainder of the low reflective layer (TaBSiON) other than B and Si are Ta, O and N. The compositional ratio (Ta:(O+N)) of Ta based on O and N is from 7:2 to 1:2. If the proportion of Ta is higher than the above composition ratio, it may not be possible to sufficiently lower the light reflectance in the wavelength region of pattern inspection light. On the other hand, if the proportion of O and N is higher than the above compositional ratio, there may occur problems such as decrease of the acid resistance of the low reflective layer (TaBSiON) or increase of the insulation property of the low reflective layer (TaBSiON) causing charge-up of the low reflective layer (TaBSiON) at a time of electron beam lithography.

The compositional ratio (Ta:(O+N)) of Ta based on O and N in the low reflective layer (TaBSiON) is preferably from 7:2 to 1:1, more preferably from 2:1 to 1:1.

When the low reflective layer (TaBSiO) or the low reflective layer (TaBSiON) is of the above-described construction, its crystalline state is amorphous, and its surface is excellent in smoothness. Specifically, the surface roughness of the low reflective layer (TaBSiO) or the low reflective layer (TaBSiON) is at most 0.5 nm rms.

As mentioned above, in order to prevent deterioration of the dimensional precision of a pattern due to an influence of edge roughness, the surface of the absorber layer may be required to be smooth. The low reflective layer (TaBSiO) or the low reflective layer (TaBSiON) is formed on the absorber layer, and for the same reason, its surface may be required to be smooth.

When the surface roughness of the surface of the low reflective layer (TaBSiO) or the low reflective layer (TaBSiON) is at most 0.5 nm rms, the surface of the low reflective layer (TaBSiO) or the low reflective layer (TaBSiON) is sufficiently smooth, whereby there will be no possibility that the dimensional precision of a pattern will deteriorate due to an influence of edge roughness. The surface roughness of the low reflective layer 15 is more preferably at most 0.4 nm rms, further preferably at most 0.3 nm rms.

The low reflective layer preferably contains N, that is, the low reflective layer (TaBSiON) is more preferred than the low reflective layer (TaBSiO) in terms of smoothness.

Here, the crystalline state of the low reflective layer (TaBSiO) or the low reflective layer (TaBSiON) being amorphous, i.e. being an amorphous structure or a fine crystalline structure, may be ascertained by an X-ray diffraction (XRD) method. When the crystalline state of the low reflective layer (TaBSiO) or the low reflective layer (TaBSiON) is of an amorphous structure or a fine crystalline structure, no sharp peak will be observed among the diffraction peaks obtainable by the XRD measurement.

In a case where the low reflective layer (TaBSiO) or the low reflective layer (TaBSiON) is formed on the absorber layer, the total thickness of the absorber layer 14 and the low reflective layer (TaBSiO) or the low reflective layer (TaBSiON) is preferably from 55 to 130 nm. Further, if the thickness of the low reflective layer (TaBSiO) or the low reflective layer (TaBSiON) is larger than the thickness of the absorber layer, the EUV light absorbing characteristic at the absorber layer 14 is likely to deteriorate. Accordingly, the thickness of the low reflective layer (TaBSiO) or the low reflective layer (TaBSiON) is preferably less than the thickness of the absorber layer. Therefore, the thickness of the low reflective layer (TaBSiO) or the low reflective layer (TaBSiON) is preferably from 5 to 30 nm, more preferably from 10 to 20 nm.

The low reflective layer (TaBSiO) or the low reflective layer (TaBSiON) can be formed by using a known film-deposition method, for example, a sputtering method such as a magnetron sputtering method or an ion beam sputtering method. In a case of using a magnetron sputtering method, the low reflective layer (TaBSiO) can be formed by any one of the following methods (1) to (3).

(1) A Ta target, a B target and a Si target are employed, and discharges at these targets are carried out simultaneously in an oxygen ($O_2$) atmosphere diluted by argon (Ar), to form the low reflective layer (TaBSiO).

(2) A TaB compound target and a Si target are employed, and discharges at these targets are carried out simultaneously in an oxygen atmosphere diluted by argon, to form the low reflective layer (TaBSiO).

(3) A TaBSi compound target is employed, and a discharge at the target in which these three elements are integrated, is carried out in an oxygen atmosphere diluted by argon, to form the low reflective layer (TaBSiO).

Here, among the above methods, in the methods ((1) and (2)) of discharging at at least two targets simultaneously, it is possible to control the composition of the low reflective layer (TaBSiO) to be formed, by adjusting the input electric power of each target.

Among the above methods, the methods (2) and (3) are preferred for the reason that it is possible to avoid unstability of discharge or the variation in the film composition or the film thickness, and the method of (3) is particularly preferred. The TaBSi compound target particularly preferably has a composition of Ta=50 to 94 at. %, Si=5 to 30 at. % and B=1 to 20 at. % for the reason that it is possible to avoid unstability of discharge or variation of the film composition or the film thickness.

The low reflective layer (TaBSiON) can be formed by carrying out the same procedure as that described above in an oxygen-nitrogen mixed gas atmosphere diluted by argon instead of the oxygen atmosphere diluted by argon. By this process, in the same manner as described above, it is possible to improve the productivity of TaBSiON film and to minimize the variation of the composition or the film thickness.

The low reflective layer (TaBSiO) can be formed by carrying out the above methods specifically under the following film-deposition conditions.

Method (2) of Employing TaB Compound Target and Si Target

Sputtering gas: mixed gas of Ar and $O_2$ ($O_2$ gas concentration: 3 to 80 vol %, preferably 5 to 30 vol %, more preferably 8 to 15 vol %. Gas pressure: $1.0\times10^{-1}$ Pa to $50\times10^{-1}$ Pa, preferably $1.0\times10^{-1}$ Pa to $40\times10^{-1}$ Pa, more preferably $1.0\times10^{1}$ Pa to $30\times10^{-1}$ Pa.).

Input electric power (for each target): 30 to 1,000 W, preferably 50 to 750 W, more preferably 80 to 500 W.

Film-deposition rate: 2.0 to 60 nm/min, preferably 3.5 to 45 nm/min, more preferably 5 to 30 nm/min.

Method (3) of Employing TaBSi Compound Target

Sputtering gas: mixed gas of Ar and $O_2$ ($O_2$ gas concentration: 3 to 80 vol %, preferably 5 to 30 vol %, more preferably 8 to 15 vol %. Gas pressure: $1.0\times10^{-1}$ Pa to $50\times10^{-1}$ Pa, preferably $1.0\times10^{-1}$ Pa to $40\times10^{-1}$ Pa, more preferably $1.0\times10^{-1}$ Pa to $30\times10^{-1}$ Pa.).

Input electric power: 30 to 1,000 W, preferably 50 to 750 W, more preferably 80 to 500 W.

Film-deposition rate: 2.0 to 50 nm/min, preferably 2.5 to 35 nm/min, more preferably 5 to 25 nm/min.

The low reflective layer (TaBSiON) can be formed by the above method specifically under the following film-deposition conditions.

Method (2) of Employing TaB Compound Target and Si Target

Sputtering gas: mixed gas of Ar, $O_2$ and $N_2$ ($O_2$ gas concentration: 5 to 30 vol %, $N_2$ gas concentration: 5 to 30 vol %; preferably $O_2$ gas concentration: 6 to 25 vol %, $N_2$ gas concentration: 6 to 25 vol %; more preferably $O_2$ gas concentration: 10 to 20 vol %, $N_2$ gas concentration: 15 to 25 vol %. Gas pressure: $1.0\times10^{-2}$ Pa to $50\times10^{-2}$ Pa, preferably $1.0\times10^{-2}$ Pa to $40\times10^{-2}$ Pa, more preferably $1.0\times10^{-2}$ Pa to $30\times10^{-2}$ Pa.).

Input electric power (for each target): 30 to 1,000 W, preferably 50 to 750 W, more preferably 80 to 500 W.

Film-deposition rate: 2.0 to 50 nm/min, preferably 2.5 to 35 nm/min, more preferably 5 to 25 nm/min.

Method (3) of Employing TaBSi Compound Target

Sputtering gas: mixed gas of Ar, $O_2$ and $N_2$ ($O_2$ gas concentration: 5 to 30 vol %, $N_2$ gas concentration: 5 to 30 vol %; preferably $O_2$ gas concentration: 6 to 25 vol %, $N_2$ gas concentration: 6 to 25 vol %; more preferably $O_2$ gas concentration: 10 to 20 vol %, $N_2$ gas concentration: 15 to 25 vol %. Gas pressure: $1.0 \times 10^{-2}$ Pa to $50 \times 10^{-2}$ Pa, preferably $1.0 \times 10^{-2}$ Pa to $40 \times 10^{-2}$ Pa, more preferably $1.0 \times 10^{-2}$ Pa to $30 \times 10^{-2}$ Pa.).

Input electric power: 30 to 1,000 W, preferably 50 to 750 W, more preferably 80 to 500 W.

Film-deposition rate: 2.0 to 50 nm/min, preferably 2.5 to 35 nm/min, more preferably 5 to 25 nm/min.

Further, in the EUV mask blank 1 of the present invention, it is preferred to form the low reflective layer 15 on the absorber layer 14, because the wavelength of light for inspection of a pattern is different from the wavelength of EUV light. Accordingly, in a case where EUV light (in the vicinity of 13.5 nm) is used as light for inspection of a pattern, it is considered unnecessary to form a low reflective layer 15 on the absorber layer 14. The wavelength of the inspection light tends to shift to the short wavelength side as the pattern dimension becomes small and in future, it may shift to 193 nm or further shift to 13.5 nm. When the wavelength of the inspection light is 13.5 nm, it will not be necessary to form the low reflective layer 15 on the absorber layer 14.

The EUV mask blank 1 of the present invention may have a functional film known in the field of EUV mask blanks, in addition to the reflective layer 12, the protective layer 13, the absorber layer 14 and the low reflective layer 15. As a specific example of such a functional film, a high dielectric coating may be mentioned which is applied on the rear side of a substrate in order to accelerate electrostatic chucking of the substrate, as disclosed in e.g. JP-A-2003-501823. Here, in the substrate 11 in FIG. 1, the rear side of the substrate means the surface on the side opposite to the side on which the reflective layer 12 is formed. For the high dielectric coating to be provided on the rear side of the substrate for such a purpose, the electrical conductivity and the thickness of the constituting material are selected so that the sheet resistance will be at most $100\Omega/\square$. The constituting material for the high dielectric coating may be selected widely from those disclosed in known literatures. For example, a high dielectric coating disclosed in JP-A-2003-501823, specifically, a coating comprising silicon, TiN, molybdenum, chromium and TaSi, may be applied. The thickness of the high dielectric coating may, for example, be from 10 to 1,000 nm.

The high dielectric coating may be formed by using a known film deposition method, for example, a sputtering method such as magnetron sputtering or ion beam sputtering, a CVD method, a vacuum deposition method or an electrolytic plating method.

EXAMPLES

Now, the present invention will be described in further detail with reference to Examples. But the present invention is not construed as limited to be these Examples.

Example 1

In this Example, an EUV mask blank 1 shown in FIG. 1 was prepared. However, in the EUV mask blank 1 in Example 1, a low reflective layer 15 was not formed on an absorber layer 14.

As a substrate 11 for film deposition, a $SiO_2$—$TiO_2$ glass substrate (size: 6 inch (152.4 mm) square, thickness: 6.3 mm) was used. This glass substrate has a thermal expansion coefficient of $0.02 \times 10^{-7}/°$ C., a Young's modulus of 67 GPa, a Poisson ratio of 0.17 and a specific rigidity of $3.07 \times 10^7$ $m^2/s^2$. This glass substrate was formed by polishing to have a smooth surface with a surface roughness (mean square roughness) of at most 0.15 nm rms and to a flatness of at most 100 nm.

On the rear side of the substrate 11, a Cr film having a thickness of 100 nm was deposited by means of magnetron sputtering to provide a high dielectric coating having a sheet resistance of $100\Omega/\square$.

To a flat plate-shaped usual electrostatic chuck, the substrate 11 (size: 6 inch (152.4 mm) square, thickness: 6.3 mm) was fixed by means of the formed Cr film, and on the surface of the substrate 11, a Si film and a Mo film were alternately deposited by ion beam sputtering for 40 cycles, to form a reflective Si/Mo multilayer film (reflective layer 12) having a total film thickness of 272 nm ((4.5 nm+2.3 nm)×40).

Further, on the reflective Si/Mo multilayer film (reflective layer 12), a Ru film (film thickness: 2.5 nm) was deposited by ion beam sputtering to form a protective layer 13.

The film deposition conditions for the Si film, the Mo film and the Ru film were as follows.

Film Deposition Conditions for Si Film
  Target: Si target (boron-doped)
  Sputtering gas: Ar gas (gas pressure: 0.02 Pa)
  Voltage: 700 V
  Film deposition rate: 0.077 nm/sec
  Film thickness: 4.5 nm Film Deposition Conditions for Mo Film
  Target: Mo target
  Sputtering gas: Ar gas (gas pressure: 0.02 Pa)
  Voltage: 700 V
  Film deposition rate: 0.064 nm/sec
  Film thickness: 2.3 nm Film Deposition Conditions for Ru Film
  Target: Ru target
  Sputtering gas: Ar gas (gas pressure: 0.02 Pa)
  Voltage: 500 V
  Film deposition rate: 0.023 nm/sec
  Film thickness: 2.5 nm Then, on the protective layer 13, a TaBSi layer as an absorber layer 14 was formed by a magnetron sputtering method to obtain an EUV mask blank 1 having the reflective layer 12, the protective layer 13 and the absorber layer 14 formed in this order on the substrate 11.

The film deposition conditions for the TaBSi layer were as follows.

Film Deposition Conditions for TaBSi Layer
  Target: TaBSi compound target (compositional ratio: Ta 80 at. %, B 10 at. %, Si 10 at. %)
  Sputtering gas: Ar gas (gas pressure: 0.3 Pa)
  Input electric power: 150 W
  Film deposition rate: 0.10 nm/sec
  Film thickness: 60 nm The following evaluations (1) to (4) were carried out with respect to the absorber layer of the EUV mask blank obtained by the above procedure.

(1) Film Composition

The composition of the absorber layer 14 (TaBSi film) was measured by using an X-ray photoelectron spectrometer (Number 5500, manufactured by PERKIN ELEMER-PHI). The compositional ratio (at. %) of the absorber layer 14 was Ta:B:Si=92:3:5 (content of Ta: 92 at. %, content of B: 3 at. %, content of Si: 5 at. %). Here, no N was detected.

(2) Crystalline Structure

The crystalline structure of the absorber layer (TaBSi film) was ascertained by an X-ray diffractometer (manufactured by Rigaku Corporation). No sharp peak was observed among the obtained diffraction peaks, whereby it was confirmed that the crystalline state of the absorber layer was of an amorphous structure or a fine crystalline structure.

(3) Surface Roughness

The surface roughness of the absorber layer (TaBSi film) was measured according to JIS-B0601 (year 1994) by using an atomic force microscope (SPI-3800, manufactured by SII). The surface roughness of the absorber layer was 0.15 nm rms.

(4) Resistance Value

The resistance value of the absorber layer (TaBSi film) was measured by using a four-point probe meter (LorestaAP MCP-T400, manufactured by Mitsubishi Yuka K. K.) and was found to be $2.0 \times 10^{-4} \Omega \cdot cm$.

Example 2

In this Example, an EUV mask blank 1 was prepared wherein a low reflective layer 15 is formed on an absorber layer 14.

In this Example, the procedure to form an absorber layer 14 on a protective layer 13 was carried out in the same manner as in Example 1. On the absorber layer 14, a TaBSiON film was formed by a magnetron sputtering method, as a low reflective layer 15 against an inspection light having a wavelength of 257 nm. The compositional ratio (at. %) of the low reflective layer was measured by the same method as in Example 1 and found to be Ta:B:Si:N:O=40:3:10:10:37.

The film deposition conditions for the TaBSiON film were as follows.

Film Deposition Conditions for TaBSiON Layer

Target: TaBSi target (compositional ratio: Ta 80 at. %, B 10 at. %, Si 10 at. %)

Sputtering gas: Mixed gas of Ar, $N_2$ and $O_2$ (Ar: 55 vol %, $N_2$: 19 vol %, $O_2$: 26 vol %, gas pressure: 0.3 Pa)

Input electric power: 150 W

Film deposition rate: 0.06 nm/sec

Film thickness: 10 nm

The following evaluations (5) and (6) were carried out with respect to the low reflective layer of the EUV mask blank obtained by the above procedure.

(5) Reflection Characteristic (Evaluation of Contrast)

In Example 1, at a stage where up to the protective layer 13 (Ru film) was formed, the reflectance on the surface of the protective layer 13 against the light (wavelength: 257 nm) for inspection of a pattern was measured by using a spectrophotometer. Further, in Example 2, after forming the low reflective layer (TaBSi) 15, the reflectance on the surface of the low reflective layer against the light for inspection of a pattern was measured. As a result, the reflectance on the surface of the protective layer 13 was 60.0%, and the reflectance on the surface of the low reflective layer 15 was 1.3%. Using such results and the above-mentioned formula, the contrast was obtained and found to be 95.7%. It was confirmed that the mask blank was excellent in the contrast against the inspection light.

With respect to the obtained EUV mask blank 1, the reflectance against EUV light was measured by irradiating the surface of the low reflective layer 15 with EUV light (wavelength: 13.5 nm). As a result, the reflectance against EUV light was 0.4%, whereby it was confirmed that the mask blank was excellent in the EUV absorption characteristic.

(6) Etching Characteristic

With respect to the etching characteristic, evaluation was carried out by the following method instead of evaluation by means of the EUV mask blank prepared by the above procedure.

On a test sample table (4 inch quartz base plate) of a RF plasma etching apparatus, a Si chip (10 mm×30 mm) having a Ru film or a TaHf film deposited thereon by the following method, was set as a test sample. In this state, the Ru film or the TaNBSi film of the Si chip set on the test sample table was subjected to plasma RF etching under the following conditions.

Bias RF: 50 W

Etching time: 120 sec

Trigger pressure: 3 Pa

Etching pressure: 1 Pa

Etching gas: $Cl_2$/Ar

Gas flow rate ($Cl_2$/Ar):20/80 sccm

Distance between electrode substrates: 55 mm

The film deposition of the Ru film was carried out under the following film deposition conditions by an ion beam sputtering method.

Film Deposition Conditions for Ru Film

Target: Ru target

Sputtering gas: Ar gas (gas pressure: 2 mTorr, flow rate: 15 sccm)

Output: 150 W

Film deposition rate: 0.23 nm/sec

Film thickness: 2.5 nm

The TaBSi film was deposited by carrying out a magnetron sputtering method by using a TaBSi target.

The film-deposition conditions were as follows.

Film Deposition Conditions for TaBSi Layer

Target: TaBSi compound target (compositional ratio: Ta 80 at. %, B 10 at. %, S: 10 at. %)

Sputtering gas: Ar gas (gas pressure: 0.3 Pa)

Input electric power: 150 W

Film deposition rate: 0.10 nm/sec

Film thickness: 60 nm

With respect to the Ru film and the TaBSi film deposited under the above conditions, the etching rates were obtained, and the etching selectivities were obtained by the following formula.

Etching selectivity=(Etching rate of TaBSi film)/(etching rate of Ru film)

The etching rate of the Ru layer was 1.4 nm/min, and the etching rate of the TaBSi film was 18.7 nm/min. The etching selectivity against the protective layer 13 is preferably at least 10, and the etching selectivity obtained by the above formula was 13.4, which showed that the selectivity was sufficient.

Example 3

This example is same as Example 1 except that the absorber layer 14 was formed under a different target composition. Here, in the EUV mask blank 1 of Example 3, no low reflective layer 15 was formed on the absorber layer 14.

In the same manner as Example 1, on a substrate on which layers until the protective layer 13 were deposited, a TaBSi layer as the absorber layer 14 was formed by using a magnetron sputtering method, to obtain an EUV mask blank 1 comprising a substrate 11 and a reflective layer 12, a protective layer 13 and an absorber layer 14 formed in this order on the substrate 11. The film-deposition conditions of the TaBSi layer were as follows.

Film-Deposition Conditions for TaBSi Layer
Target: TaBSi compound target (compositional ratio: Ta 85 at. %, B 10 at. %, Si 5 at. %)
Sputtering gas: Ar gas (gas pressure: 0.3 Pa)
Input electric power: 150 W
Film-deposition rate: 0.10 nm/sec
Film thickness: 60 nm With respect to the absorber layer of the EUV mask blank obtained by the above procedure, the following evaluations (1) to (4) were carried out.

(1) Film Composition

The composition of the absorber layer (TaBSi film) was measured by the same method as that of Example 1, and as a result, the compositional ratio (at. %) of the absorber layer was Ta:B:Si=94:3:3 (the content of Ta was 94 at. %, the content of B was 3 at. %, the content of Si was 3 at. %). Here, no N was detected.

(2) Crystalline Structure

The crystalline structure of the absorber layer (TaBSi film) was measured by the same method as that of Example 1, and as a result, there was no sharp peak observed among diffraction peaks obtained, and accordingly, it was confirmed that the crystalline structure of the absorber layer was an amorphous structure or a fine crystalline structure.

(3) Surface Roughness

The surface roughness of the absorber layer (TaBSi film) was measured by the same method as that of Example 1, and as a result, the surface roughness of the absorber layer was 0.20 nm rms.

(4) Resistance Value

The resistance value of the absorber layer (TaBSi film) was measured by the same method as that of Example 1, and as a result, it was $1.5 \times 10^{-4} \Omega \cdot cm$.

Example 4

In this Example, an EUV mask blank 1 wherein a low reflective layer 15 was formed on an absorber layer 14, was prepared.

In this Example, the procedure until formation of the absorber layer 14 on a protective layer 13 was carried out in the same manner as Example 3. On the absorber layer 14, a TaBSiON film as the low reflective layer against inspection light having a wavelength of 257 nm, was formed by using a magnetron sputtering method. The compositional ratio (at. %) of the low reflective layer was measured by the same method as that of Example 1, and as a result, it was Ta:B:Si:N:O=45:3:5:1:0:37.

The film-deposition conditions for the TaBSiON film were as follows.
Film-Deposition Conditions for TaBSiON Layer
Target: TaBSi target (compositional ratio: Ta 85 at. %, B 10 at. %, Si 5 at. %)
Sputtering gas: mixed gas of Ar, $N_2$ and $O_2$ (Ar: 55 vol %, $N_2$: 19 vol %, $O_2$: 26 vol %, gas pressure: 0.3 Pa)
Input electric power: 150 W
Film-deposition rate: 0.06 nm/sec
Film thickness: 10 nm With respect to the low reflective layer of the EUV mask blank obtained by the above procedure, the following evaluations (5) and (6) were carried out.

(5) Reflection Characteristic (Evaluation of Contrast)

In Example 3, the reflection characteristic was measured by the same method as that of Example 2 and as a result, the reflectance on a surface of the protective layer 13 was 60.0%, and the reflectance on a surface of the low reflective layer 15 was 1.5%. By using these results and the above formula, the contrast was obtained and it was 95.1%, whereby it was confirmed that the mask blank was excellent in the contrast against inspection light.

With respect to the EUV mask blank 1 obtained, measurement was made by the same method as that of Example 2, and as a result, the reflectance against EUV light was 0.3%, and it was confirmed that the mask blank was excellent in EUV absorption property.

(6) Etching Characteristic

Etching characteristic was evaluated by the same method as that of Example 2. The film-deposition conditions for the TaBSi film were as follows.
Film-Deposition Conditions For TaBSi Layer
Target: TaBSi compound target (compositional ratio: Ta 85 at. %, B 10 at. %, Si 5 at. %)
Sputtering gas: Ar gas (gas pressure: 0.3 Pa)
Input electric power: 150 W
Film-deposition rate: 0.10 nm/sec
Film thickness: 60 nm With respect to a Ru film and a TaBSi film deposited under the above conditions, the etching rate was obtained and the etching selectivity was obtained by using the following formula.

The etching rate of the Ru layer was 1.4 nm/min, and the etching rate of the TaBSi film was 19.0 nm/min. The etching selectivity against the protective layer 13 is preferably at least 10, and the etching selectivity obtained by the above formula was 13.6, which showed that the selectivity was sufficient.

Comparative Example 1

Comparative Example 1 was carried out in the same procedure as that of Example 1 except that the absorber layer is a film of a nitride of a tantalum boron silicon alloy (TaBSiN) containing nitrogen. The TaBSiN film was deposited by using a TaBSi target (Ta:B:Si=80 at. %:10 at. %:10 at. %) under the following conditions.
Film Deposition Conditions for TaBSiN Layer
Target: TaBSi compound target (compositional ratio: Ta 85 at. %, B 10 at. %, Si 10 at. %)
Sputtering gas: mixed gas of Ar and $N_2$ (Ar: 86 vol %, $N_2$: 14 vol %, gas pressure: 0.3 Pa)
Input electric power: 150 W
Film-deposition rate: 0.095 nm/sec
Film thickness: 60 nm With respect to the absorber layer (TaBSiN film) obtained by the above procedure, the following evaluations (1) to (4) were carried out.

(1) Film Composition

The composition of the absorber layer (TaBSiN film) was measured by using an X-ray Photoelectron Spectrometer (model 5500,manufactured by PERKIN ELEMER-PHI). The compositional ratio (at. %) of the absorber layer was Ta:B:Si:N=70:3:10:17 (content of Ta: 70 at. %, content of B: 3 at. %, content of Si: 10 at. %, content of N: 17 at. %).

(2) Crystalline Structure

The crystalline structure of the absorber layer (TaBSiN film) was ascertained by an X-ray diffractometer (manufactured by Rigaku Corporation). No sharp peak was observed among obtained diffraction peaks, whereby it was confirmed that the crystalline state of the absorber layer was an amorphous structure or a fine crystalline structure.

(3) Surface Roughness

The surface roughness of the absorber layer (TaBSiN film) was measured according to JIS-B0601 (year 1994) by using an Atomic Force Microscope (SPI-3800, manufactured by Seiko Instruments Inc.). The surface roughness of the absorber layer was 0.16 nm rms.

By the same procedure as that of Example 2, a mask blank 1 wherein a low reflective layer (TaBSiON) 15 was formed on an absorber layer (TaBSiN film) 14, was prepared, and the reflectivity against pattern inspection light (257 nm) was measured. As a result, the reflectivity on a surface of a protective layer 13 was 60.0%, and the reflectivity on a surface of the low reflective layer 15 was 6.9%. Using these results and the above-described formula, the contrast was obtained, and it was 79.4%, which shows that the contrast against the pattern inspection light was lower than that of Example 2.

With respect to the EUV mask blank 1 obtained, the reflectance against EUV light was measured by irradiating a surface of the low reflective layer 15 with EUV light (wavelength 13.5 nm). As a result, the reflectance against EUV light was 0.4%.

Further, by using the same method as that of Example 2, the etching selectivity of the TaBSiN layer based on the Ru layer was obtained, and the etching characteristics were evaluated. The etching rate of the Ru layer was 1.4 nm/min, and the etching rate of the TaBSiN film was 14.3 nm/min. Using these results and the above-described formula, the etching selectivity was obtained, and it was found to be 10.2, which showed that the etching selectivity was lower as compared with Example 2.

INDUSTRIAL APPLICABILITY

The present invention provides an EUV mask blank which can avoid unstability of discharge or variation of film composition or film thickness, which is excellent in the characteristics of EUV mask blank, and which has an absorber layer having a low reflectance in wavelength regions of EUV light and pattern inspection light and whose film composition and film thickness can be easily controlled to desired ones. This mask blank is useful for a photolithography method using EUV light for a technique of transferring of fine patterns.

The entire disclosure of Japanese Patent Application No. 2007-108042 filed on Apr. 17, 2007 including specification, claims, drawings and summary is incorporated herein by reference in its entirety.

What is claimed is:

1. A reflective mask blank for EUV lithography, which comprises a substrate, and a reflective layer to reflect EUV light and an absorber layer to absorb EUV light, formed in this order on the substrate, wherein the absorber layer contains tantalum (Ta), boron (B) and silicon (Si), and in the absorber layer, the content of B is at least 1 at. % and less than 5 at. % and the content of Si is from 1 to 25 at. %, and wherein the absorber layer contains no nitrogen (N) or at most 10 at. % of N.

2. A reflective mask blank for EUV lithography, which comprises a substrate, and a reflective layer to reflect EUV light and an absorber layer to absorb EUV light, formed in this order on the substrate, wherein the absorber layer contains tantalum (Ta), boron (B) and silicon (Si), the absorber layer contains no nitrogen (N) or at most 10 at. % of N, and the crystalline state of the absorber layer is amorphous.

3. The reflective mask blank for EUV lithography according to claim 1, wherein the absorber layer contains no nitrogen (N) or at most 5 at. % of N.

4. The reflective mask blank for EUV lithography according to claim 2, wherein the absorber layer contains no nitrogen (N) or at most 5 at. % of N.

5. The reflective mask blank for EUV lithography according to claim 1, wherein the absorber layer has a surface roughness of at most 0.5 nm rms.

6. The reflective mask blank for EUV lithography according to claim 2, wherein the absorber layer has a surface roughness of at most 0.5 nm rms.

7. The reflective mask blank for EUV lithography according to claim 1, wherein a low reflective layer against an inspection light to be used for inspection of a mask pattern is formed on the absorber layer, the low reflective layer contains tantalum (Ta), boron (B), silicon (Si) and oxygen (O), and in the low reflective layer, the content of B is at least 1 at. % and less than 5 at. %, the content of Si is from 1 to 25 at. %, and the compositional ratio (Ta:O) of Ta to O is from 7:2 to 1:2.

8. The reflective mask blank for EUV lithography according to claim 2, wherein a low reflective layer against an inspection light to be used for inspection of a mask pattern is formed on the absorber layer, the low reflective layer contains tantalum (Ta), boron (B), silicon (Si) and oxygen (O), and in the low reflective layer, the content of B is at least 1 at. % and less than 5 at. %, the content of Si is from 1 to 25 at. %, and the compositional ratio (Ta:O) of Ta to O is from 7:2 to 1:2.

9. The reflective mask blank for EUV lithography according to claim 1, wherein a low reflective layer against an inspection light to be used for inspection of a mask pattern is formed on the absorber layer, the low reflective layer contains tantalum (Ta), boron (B), silicon (Si), oxygen (O) and nitrogen (N), and in the low reflective layer, the content of B is at least 1 at. % and less than 5 at. %, the content of Si is from 1 to 25 at. %, and the compositional ratio (Ta:(O+N)) of Ta to O and N is from 7:2 to 1:2.

10. The reflective mask blank for EUV lithography according to claim 2, wherein a low reflective layer against an inspection light to be used for inspection of a mask pattern is formed on the absorber layer, the low reflective layer contains tantalum (Ta), boron (B), silicon (Si), oxygen (O) and nitrogen (N), and in the low reflective layer, the content of B is at least 1 at. % and less than 5 at. %, the content of Si is from 1 to 25 at. %, and the compositional ratio (Ta:(O+N)) of Ta to O and N is from 7:2 to 1:2.

11. The reflective mask blank for EUV lithography according to claim 7, wherein a protective layer to protect the reflective layer during formation of a pattern in the absorber layer, is formed between the reflective layer and the absorber layer, and the contrast between light reflected on the surface of the protective layer and light reflected on the surface of the low reflective layer at a wavelength of light to be used for inspection of the pattern formed in the absorber layer, is at least 30%.

12. The reflective mask blank for EUV lithography according to claim 8, wherein a protective layer to protect the reflective layer during formation of a pattern in the absorber layer, is formed between the reflective layer and the absorber layer, and the contrast between light reflected on the surface of the protective layer and light reflected on the surface of the low reflective layer at a wavelength of light to be used for inspection of the pattern formed in the absorber layer, is at least 30%.

13. The reflective mask blank for EUV lithography according to claim 9, wherein a protective layer to protect the reflective layer during formation of a pattern in the absorber layer, is formed between the reflective layer and the absorber layer, and the contrast between light reflected on the surface of the protective layer and light reflected on the surface of the low reflective layer at a wavelength of light to be used for inspection of the pattern formed in the absorber layer, is at least 30%.

14. The reflective mask blank for EUV lithography according to claim 10, wherein a protective layer to protect the reflective layer during formation of a pattern in the absorber layer, is formed between the reflective layer and the absorber layer, and the contrast between light reflected on the surface of the protective layer and light reflected on the surface of the low reflective layer at a wavelength of light to be used for inspection of the pattern formed in the absorber layer, is at least 30%.

15. The reflective mask blank for EUV lithography according to claim 1, wherein the absorber layer is formed by carrying out a sputtering method using a target made of a TaBSi compound in an atmosphere wherein the total partial pressure of gases containing nitrogen atoms is not more than $1 \times 10^{-4}$ Pa.

16. The reflective mask blank for EUV lithography according to claim 2, wherein the absorber layer is formed by carrying out a sputtering method using a target made of a TaBSi compound in an atmosphere wherein the total partial pressure of gases containing nitrogen atoms is not more than $1 \times 10^{-4}$ Pa.

\* \* \* \* \*

UNITED STATES PATENT AND TRADEMARK OFFICE
CERTIFICATE OF CORRECTION

| | | |
|---|---|---|
| PATENT NO. | : 8,088,538 B2 | Page 1 of 1 |
| APPLICATION NO. | : 12/578648 | |
| DATED | : January 3, 2012 | |
| INVENTOR(S) | : Kazuyuki Hayashi et al. | |

It is certified that error appears in the above-identified patent and that said Letters Patent is hereby corrected as shown below:

On the title page, Item (75), should read:

--(75) Inventors: Kazuyuki Hayashi, Chiyoda-ku (JP);
Kazuo Kadowaki, Chiyoda-ku (JP);
Masaki Mikami, Chiyoda-ku (JP);
Takashi Sugiyama, Chiyoda-ku (JP)--

Signed and Sealed this
Sixth Day of March, 2012

David J. Kappos
*Director of the United States Patent and Trademark Office*